United States Patent
Choi et al.

(10) Patent No.: US 7,453,722 B2
(45) Date of Patent: Nov. 18, 2008

(54) PHASE CHANGE MEMORY DEVICE AND MEMORY CELL ARRAY THEREOF

(75) Inventors: Byung-Gil Choi, Yongin-si (KR);
Jong-Soo Seo, Hwaseong-gun (KR);
Young-Kug Moon, Suwon-si (KR);
Bo-Tak Lim, Yongin-si (KR); Su-Yeon Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 28 days.

(21) Appl. No.: 11/319,364

(22) Filed: Dec. 29, 2005

(65) Prior Publication Data

US 2007/0133268 A1    Jun. 14, 2007

(30) Foreign Application Priority Data

Dec. 9, 2005    (KR)    ............ 10-2005-0120603

(51) Int. Cl.
*G11C 11/00*    (2006.01)
(52) U.S. Cl. .................. 365/163; 365/63; 365/113
(58) Field of Classification Search .......... 365/163, 365/63, 113
See application file for complete search history.

(56) References Cited

U.S. PATENT DOCUMENTS

| | | | |
|---|---|---|---|
| 6,754,107 B2 | 6/2004 | Khouri et al. | |
| 6,982,902 B2 * | 1/2006 | Gogl et al. | 365/158 |
| 7,335,906 B2 * | 2/2008 | Toda | 257/2 |
| 2004/0174732 A1 * | 9/2004 | Morimoto | 365/148 |
| 2006/0203541 A1 * | 9/2006 | Toda | 365/163 |

FOREIGN PATENT DOCUMENTS

| | | |
|---|---|---|
| JP | 08-153393 | 6/1996 |
| KR | 0166420 | 2/1999 |
| KR | 100206917 B1 | 4/1999 |
| KR | 1020000043969 A | 7/2000 |
| KR | 102000058001 A | 9/2000 |
| KR | 10-2005-0079030 | 8/2005 |

* cited by examiner

*Primary Examiner*—Huan Hoang
(74) *Attorney, Agent, or Firm*—Volentine & Whitt, P.L.L.C.

(57) ABSTRACT

A phase change memory device is provided which includes a memory cell array including a plurality of memory cells, and a write driver for supplying a program current to the memory cell array through a global bitline. The memory cell array includes first and second cell regions, a first local bitline connected to the first cell region, a second local bitline connected to the second cell region, and a select region disposed between the first and second cell regions and supplying the program current supplied through the global bitline to the first and second local bitlines in response to a local select signal.

20 Claims, 7 Drawing Sheets

Fig. 1

(Conventional Art)

Fig. 2

(Conventional Art)

Fig. 3

(Conventional Art)

PHASE CHANGE MEMORY DEVICE AND MEMORY CELL ARRAY THEREOF

BACKGROUND

The present invention relates to semiconductor memory devices and, more particularly, to phase change memory devices and memory cell arrays thereof.

A claim of priority under 35 U.S.C. § 119 is made to Korean Patent Application 2005-120603 filed on Dec. 9, 2005, the entire contents of which are hereby incorporated by reference.

Generally, semiconductor memory devices are categorized as random access memories (RAMs) or read-only memories (ROMs). ROMs are non-volatile memory devices such as PROMs (programmable ROMs), EPROMs (erasable PROMs), EEPROMs (electrically EPROMs), and flash memory devices, which retain their stored data even when their power supplies are interrupted. Meanwhile, RAMs are traditionally volatile memory devices such as dynamic RAMs (DRAMs) and static RAMs (SRAMs), which lose their stored data when their power supplies are interrupted.

However, new types of RAMs containing nonvolatile memory devices have recently been introduced or proposed. Examples includes ferroelectric RAMs (FRAMs) employing ferroelectric capacitors, magnetic RAMs (MRAMs) employing tunneling magneto-resistive (TMR) films, and phase change memories (PRAMs) using chalcogenide alloys. Among these, the phase change memory devices are relatively easy to fabricate, and thus phase change memory devices may provide the best opportunities in the actual implementation of high-capacity, low cost nonvolatile RAMs.

Figure 1:
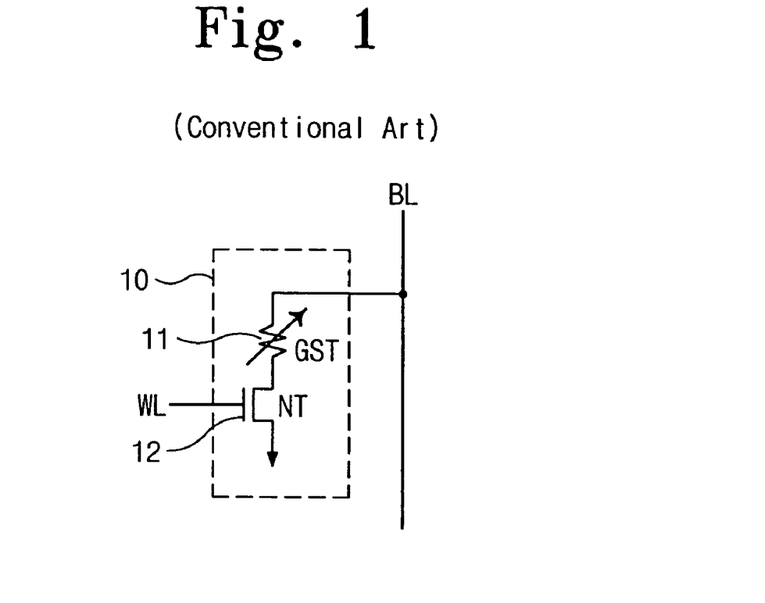
FIG. 1 illustrates an example of memory cell of a phase change memory device.

FIG. 1 illustrates an example of a memory cell 10 of a phase change memory device. As shown, the memory cell 10 includes a memory element 11 and a select element 12 connected between a bitline BL and a ground voltage. In this example, the select element 12 is an NMOS transistor NT having a gate connected to a wordline WL.

The memory element 11 includes a phase change material such as germanium-antimony-tellurium (Ge—Sb—Te, also referred to as "GST"), which functions as a variable resistor (i.e., resistance being variable with heat). The phase change material is conditioned in one of two stable states, i.e., a crystalline state or an amorphous state. The phase change material changes into the crystalline state or the amorphous state, based on current supplied through the bitline BL. The phase change memory programs data therein by means of such a characteristic of the phase change material.

When a predetermined voltage is applied to the wordline WL, the NMOS transistor NT is turned on to enable the memory element 11 to receive the current supplied through the bitline BL.

In FIG. 1, the memory element 11 is coupled between the bitline BL and the select element 12. However, the select element 12 may instead be coupled between the bitline BL and the memory element 11.

Figure 2:
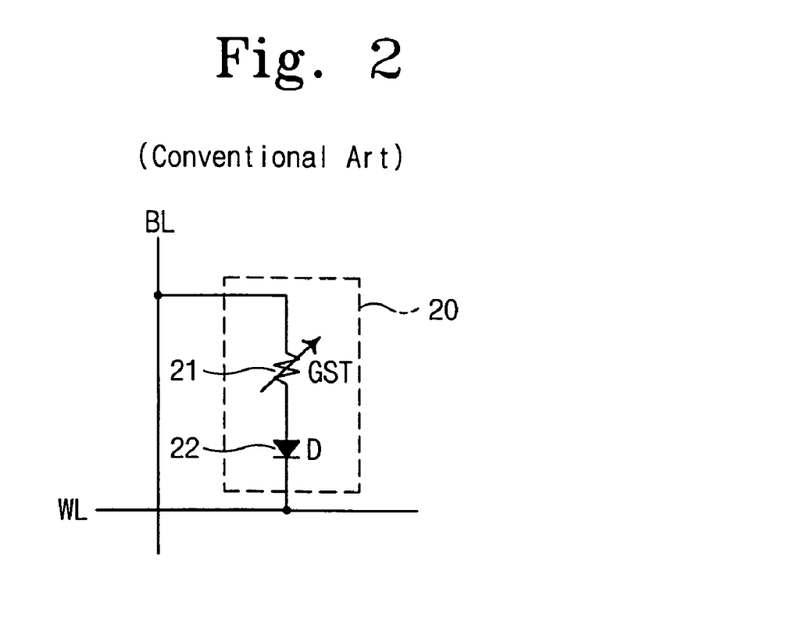
FIG. 2 illustrates another example of a memory cell of a phase change memory device.

FIG. 2 illustrates another example of a memory cell 20 of a phase change memory device. The memory cell 20 includes a memory element 21 and a select element 22 connected between a bitline BL and a wordline WL. The select element 22 of this example includes a diode D having an anode to which the memory element 21 is connected and a cathode to which the wordline WL is connected. When a voltage differential between the anode and the cathode of the diode D becomes higher than a threshold voltage of the diode D, the diode D is turned on to enable the memory element 21 to receive the current supplied through the bitline BL.

In FIG. 2, the memory element 21 is coupled between the bitline BL and the select element 22. However, the select element 22 may instead be coupled between the bitline BL and the memory element 21.

Figure 3:
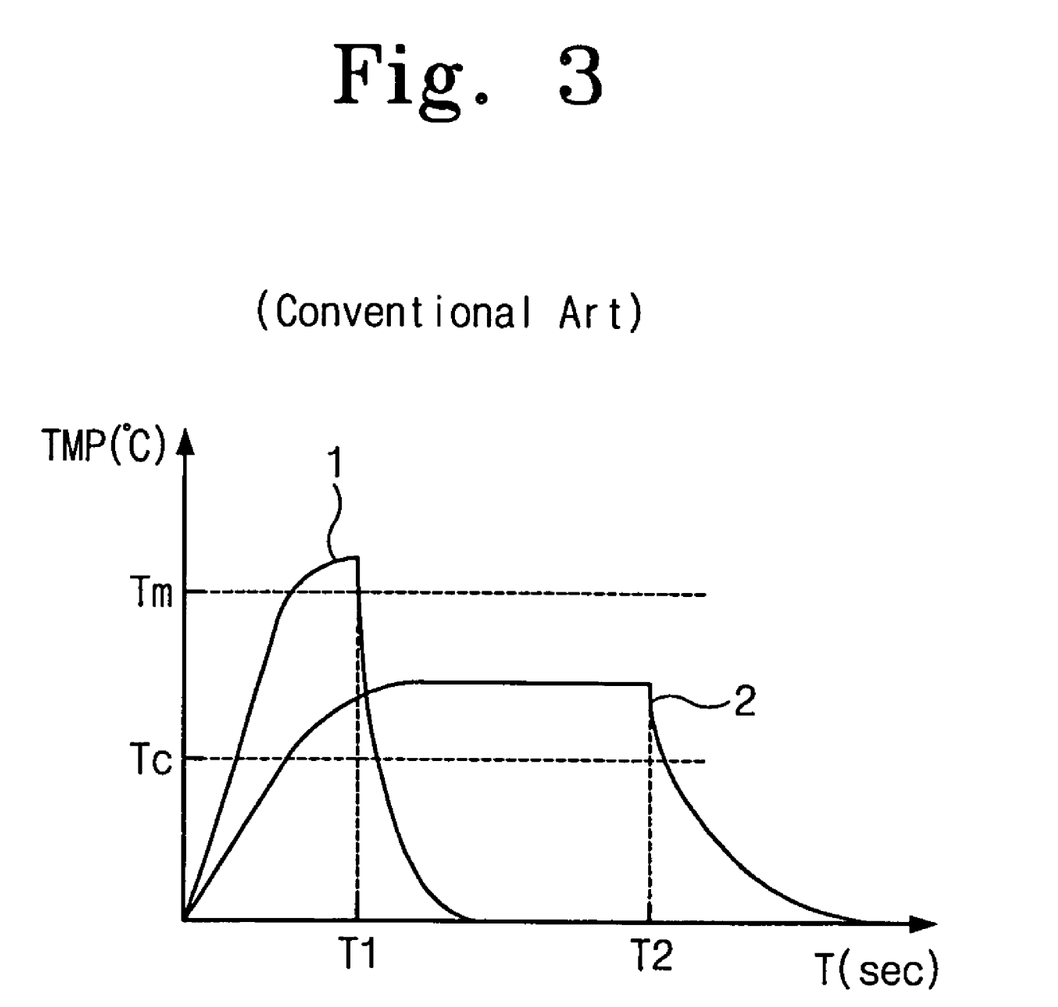
FIG. 3 is a graph showing temperature characteristics during programming of a phase change material.

FIG. 3 is a graph showing temperature characteristics during programming of the phase change material (GST) illustrated in FIG. 1 and FIG. 2. In FIG. 3, a reference number 1 denotes the GST temperature characteristic during programming to the amorphous state, while a reference number 2 denotes the GST temperature characteristic during programming to the crystalline state.

As illustrated in FIG. 3, the phase change material (GST) turns to the amorphous state when it is rapidly quenched after being heated over its melting point Tm by supplied current during a time T1. The amorphous state is usually referred to as a reset state, storing data '1'. On the other hand, the phase change material is settled in the crystalline state when it is slowly quenched after being heated within a temperature window that higher than a crystallization temperature Tc and low than the melting point Tm during a time T2 which is longer than T1. The crystalline state is usually referred to as a set state, storing data '0'. The resistance in the memory cell is relatively high in the amorphous state, and relatively low in the crystalline state.

The terms "crystalline" and "amorphous" are relative terms in the context of phase-change materials. That is, when a phase-change memory cell is said to be in its crystalline state, one skilled in the art will understand that the phase-change material of the cell has a more well-ordered crystalline structure when compared to its amorphous state. A phase-change memory cell in its crystalline state need not be fully crystalline, and a phase-change memory cell in its amorphous state need not be fully amorphous.

The phase change memory cell is programmed in the reset state or set state in accordance with the magnitude and duration of a programming current applied to the cell. Generally, the phase change memory is configured to supply a predefined "reset current" for programming the memory cell in the reset state, and a predefined "set current" for programming the memory cell in the set state.

As illustrated in FIG. 3, in order to change a phase change material (GST) into a crystalline state, the magnitude and duration of set current should achieve a GST temperature ranging from Tc to Tm during a time T2. In order to change a phase change material into an amorphous state, the magnitude and duration of the reset current should achieve a GST temperature exceeding Tm during a time T1. Generally, the magnitude of the reset current is greater than that of the set current, while the duration of the reset current is less than that of the set current.

A typical phase change memory device includes a memory cell array and a writer driver. The memory cell array is connected to a wordline decoder through a wordline and to a global bitline select circuit through a global bitline. The memory cell array includes a cell region and a select region. The cell region has a plurality of memory cells, and the select region has an NMOS transistor connecting global bitlines with local bitlines. A number of memory cells are connected with a local bitline.

The write driver supplies a program current (i.e., a set current or a reset current) to a selected memory cell through a global bitline and a local bitline in a program operation. Unfortunately, parasitic resistance and parasitic capacitance present on the local bitline may prevent the write driver from supplying a sufficient program current to a selected memory cell. For this reason, programming reliability of the phase change memory device may be degraded.

SUMMARY OF THE INVENTION

Exemplary embodiments of the present invention are directed to a phase change memory device for effectively supplying a program current to a selected memory cell, and to a memory cell array of the phase change memory device.

In an exemplary embodiment, a memory cell array of a phase change memory device is provided which includes first and second cell regions, a first local bitline connected to the first cell region, a second local bitline connected to the second cell region, and a select region disposed between the first and second regions and connecting the first and second local bitlines with a global bitline in response to a local select signal.

In another exemplary embodiment, a phase change memory device is provided which includes a memory cell array including a plurality of memory cells, and a write driver for supplying a program current to the memory cell array through a global bitline. The memory cell array includes first and second cell regions, a first local bitline connected to the first cell region, a second local bitline connected to the second cell region, and a select region disposed between the first and second cell regions and supplying the program current supplied through the global bitline to the first and second local bitlines in response to a local select signal.

BRIEF DESCRIPTION OF THE DRAWINGS

The above and other aspect and features of the present invention will become readily apparent from the detailed description that follows, with reference to the accompanying drawings, in which.

DETAILED DESCRIPTION OF PREFERRED EMBODIMENTS

Preferred embodiments of the present invention will be now described hereinafter more fully with reference to the accompanying drawings. The invention may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the specification.

Figure 4:
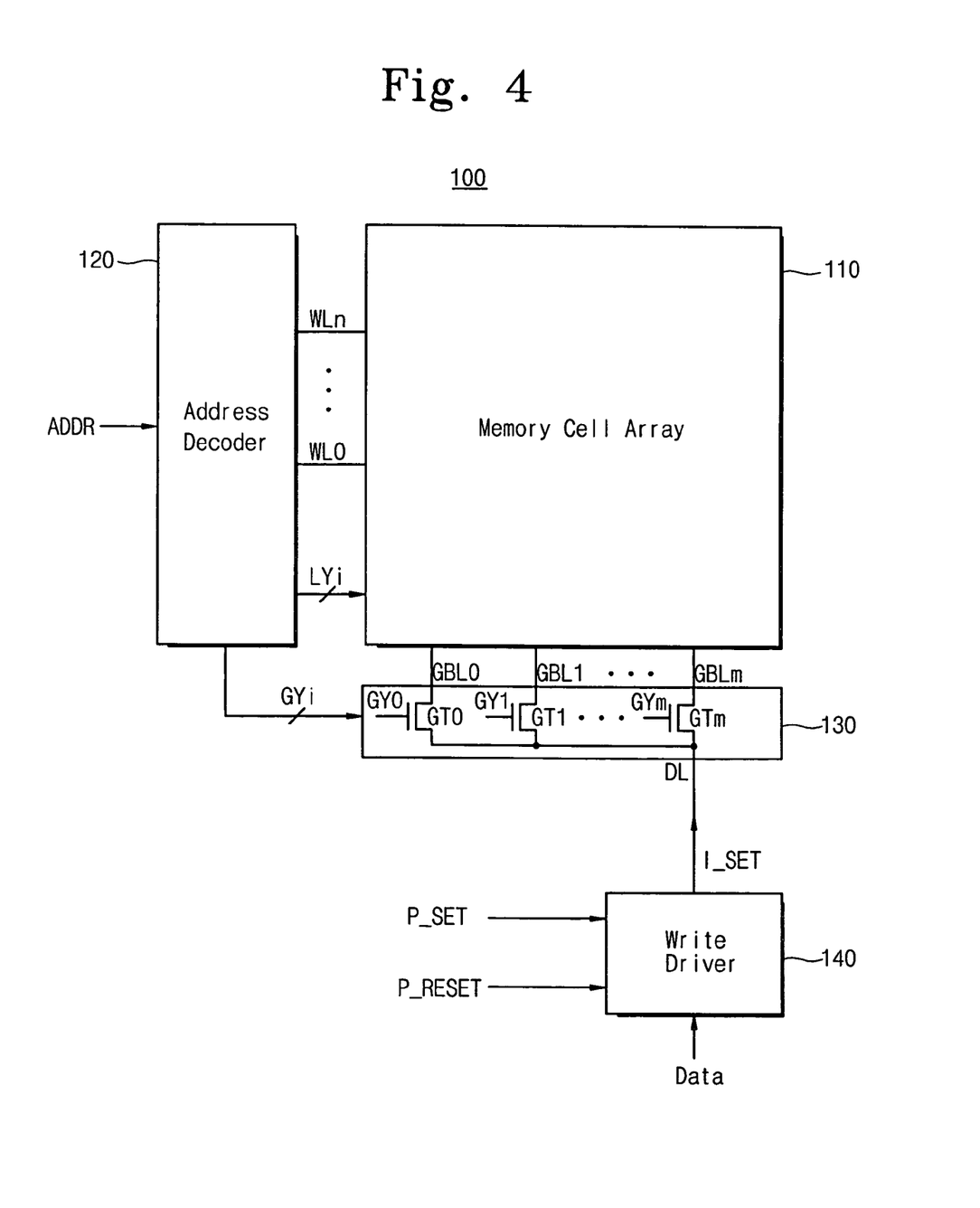
FIG. 4 is a block diagram of a phase change memory device according to an embodiment of the present invention.

FIG. 4 is a block diagram of a phase change memory device 100 according to an embodiment of the present invention. As shown, the phase change memory device 100 includes a memory cell array 110, an address decoder 120, a global bitline select circuit 130, and a write driver 140.

The memory cell array 10 is connected with a plurality of wordlines WL0-WLn and a plurality of global bitlines GBL0-GBLm, and includes a cell Region (not shown) and a select region (not shown). The cell region has a plurality of memory cells each being connected with a wordline and a local bitline. A number of bitlines are connected with a local bitline. The select region is coupled between a global bitline and a plurality of local bitlines, and connects a local bitline selected by a local select signal LYj with the global bitline. Exemplary configurations of the memory cell array 110 will be be described in detail later with reference to FIG. 5 through FIG. 8.

The address decoder 120 decodes an externally input address ADDR controls selection of the wordlines, global bitlines, and local bitlines. The address ADDR includes row address RA data for selecting wordlines and a column address CA data for selecting the global and local bitlines. Referring to FIG. 4, the global bitlines are selected by global select signals GYi, and the local bitlines LBL are selected by local select signals LYj.

The global bitline select circuit 130 selects global bitlines in response to the global select signals GYi (i=0-m) from the address decoder 120 and includes a plurality of NMOS transistors GT0-GTm. The NMOS transistors GT0-GTm connect the global bitlines GBL0-GBLm with a data line DL. When, for example, a global select signal GY0 is enabled, the global bitline GBL0 and the data line DL are electrically connected with each other.

The write driver 140 supplies a program current to a selected global bitline (e.g., GBL0) via the data line DL. In accordance with the logic value of input data, the write driver 140 supplies either a set current I_SET or a reset current I_RESET to the global bitline GBL0. The write driver 140 is responsive to a set pulse P_SET or a reset pulse P_RESET, respectively, to generate the set current I_SET or the reset current I_RESET. An example of the write driver 140 is described in detail with reference to FIG. 6 of Korean Patent Application No. 10-2003-35607 and will thus not be described in further detail.

Figure 5:
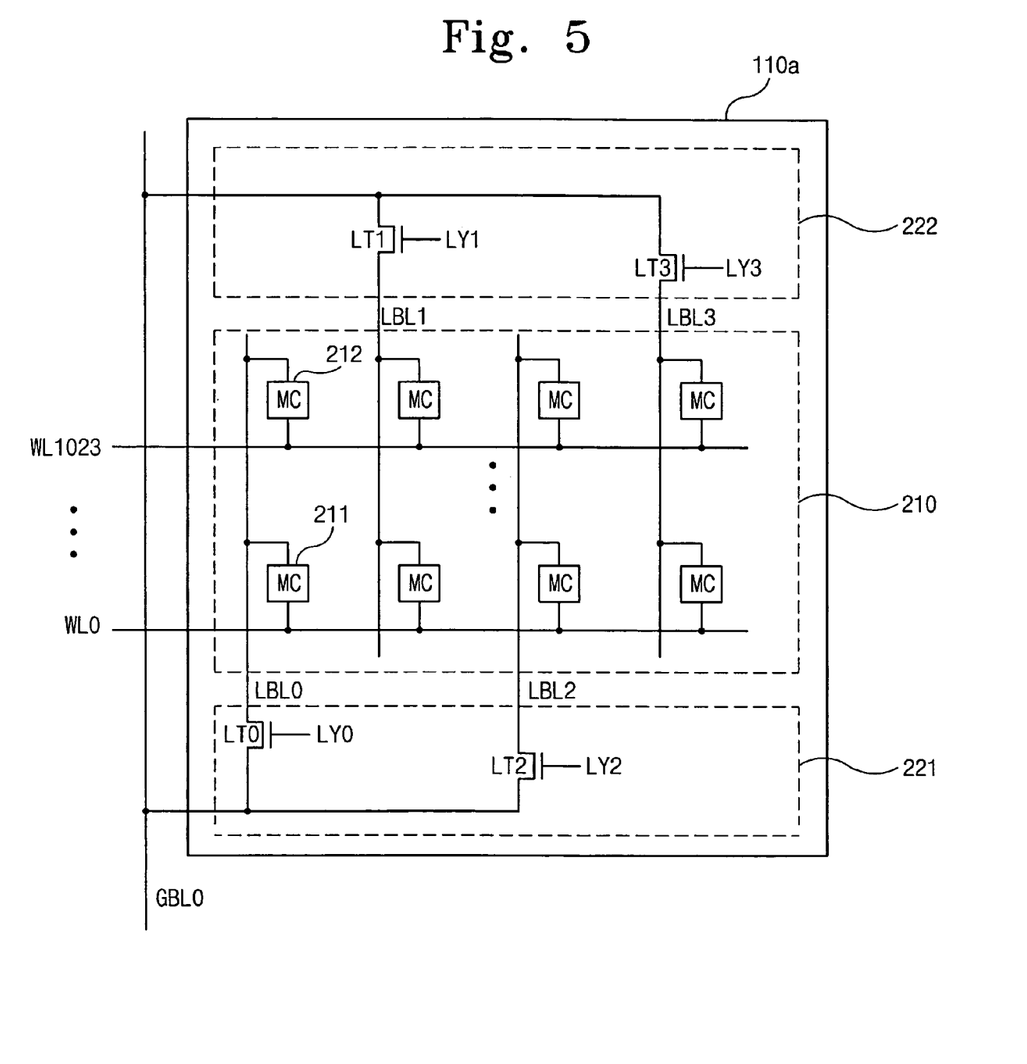
FIG. 5 illustrates a memory cell array shown in FIG. 4 according to an embodiment of the present invention.

FIG. 5 illustrates an example memory cell array 110a of a memory cell array 110 (FIG. 4) according to an embodiment of the present invention.

Referring to FIG. 5, the illustrated memory cell array 110a is connected to the global bitline GBL0 shown in FIG. 4. However, two or more memory cell arrays may be connected thereto. The memory cell array 110a includes a cell region 210, a first select region 221, and a second select region 222. The cell region 210 is disposed between the first select region 221 and the second select region 222.

The cell region 210 is connected to a plurality of wordlines (e.g., WL0-WL1023) and a plurality of local bitlines LBL0-LBL3. The wordlines WL0-WL1023 are connected to a wordline decoder (120 of FIG. 4). The local bitlines LBL0 and LBL2 are connected to the first select region 221, and the local bitlines LBL1 and LBL3 are connected to the second select region 222.

The cell region 210 includes a plurality of memory cells MC each having a memory element and a select element. In this example, each memory element includes a phase change material (GST), and the select element includes a diode (D of FIG. 2). However, the invention is not limited in this manner. For example, the select element may include an NMOS transistor (NT of FIG. 1) instead of a diode. In this case, a wordline is connected to a gate of the NMOS transistor.

The first select region 221 includes NMOS transistors LT0 and LT2, which electrically connect the global bitline GBL0 with local bitlines LBL0 and LBL2 in response to local select signals LY0 and LY2. Specifically, the NMOS transistor LT0 electrically connects the global bitline GBL0 with the local bitline LBL0 in response to the local select signal LY0, and the NMOS transistor LT2 electrically connects the global bitline GBL0 with the local bitline LBL2 in response to the local select signal LY0.

The second select region 222 includes NMOS transistors LT1 and LT3, which electrically connect the global bitline with local bitlines LBL1 and LBL3 in response to local select signals LY1 and LY3. Specifically, the NMOS transistor LT1 electrically connects the global bitline GBL0 with the local bitline LBL1 in response to the local select signal LY1, and the NMOS transistor LT3 electrically connects the global bitline GBL0 with the local bitline LBL3 in response to the local select signal LY3.

As illustrated in FIG. 5, the first and second select regions 221 and 222 are disposed at opposite sides of the cell region 210, respectively. Since the select transistors are not located immediately adjacent one another, the memory cell array 110a illustrated in FIG. 5 may occupy a smaller layout area than an array in which a select region is disposed at any one portion of a cell region.

Figure 6:
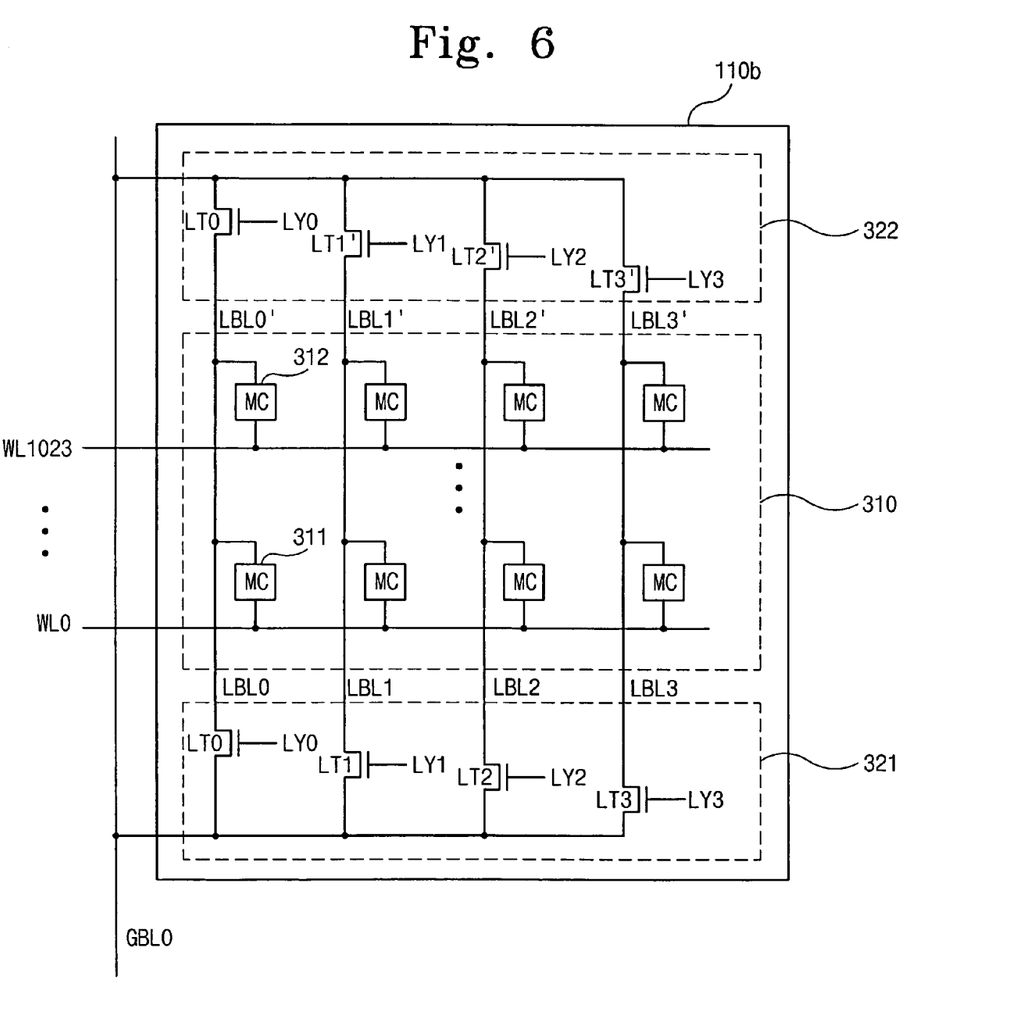
FIG. 6 illustrates a memory cell array shown in FIG. 4 according to another embodiment of the present invention.

FIG. 6 illustrates an example memory cell array 110b of a memory cell array 110 (FIG. 4) according to an embodiment of the present invention.

Referring to FIG. 6, the memory cell array 110b includes a cell region 310, a first select region 321, and a second select region 322. Similarly to FIG. 5, the cell region 310 is disposed between the first and second select regions 321 and 322.

The first select region 321 includes LT10-LT3, which electrically connect the global bitline GBL0 with local bitlines LBL0-LBL3 in response to local select signals LY0-LY3. The second select region 322 includes LT0'-LT3', which electrically connect the global bitline GBL0 with local bitlines LBL0'-LBL3' in response to the local select signals LY0-LY3. The local bitlines LBL0-LBL3 are connected to their corresponding local bitlines LBL0'-LBL3'.

According to the memory cell array 110b illustrated in FIG. 6, since a program current is simultaneously supplied through the first and second select regions 321 and 322, a sufficient set or reset current may be supplied to a selected memory cell. When, for example, the local select signal LY0 is enabled, a program currents is simultaneously supplied from the local bitlines LBL0 and LBL0' to the memory cell 311 or 312. In this respect, the embodiment of FIG. 6 is advantageous to that of FIG. 5. However, the embodiment of FIG. 5 has an advantage over the embodiment of FIG. 6 in that the embodiment of FIG. 5 is capable of being implemented in a reduced layout area.

Figure 7:
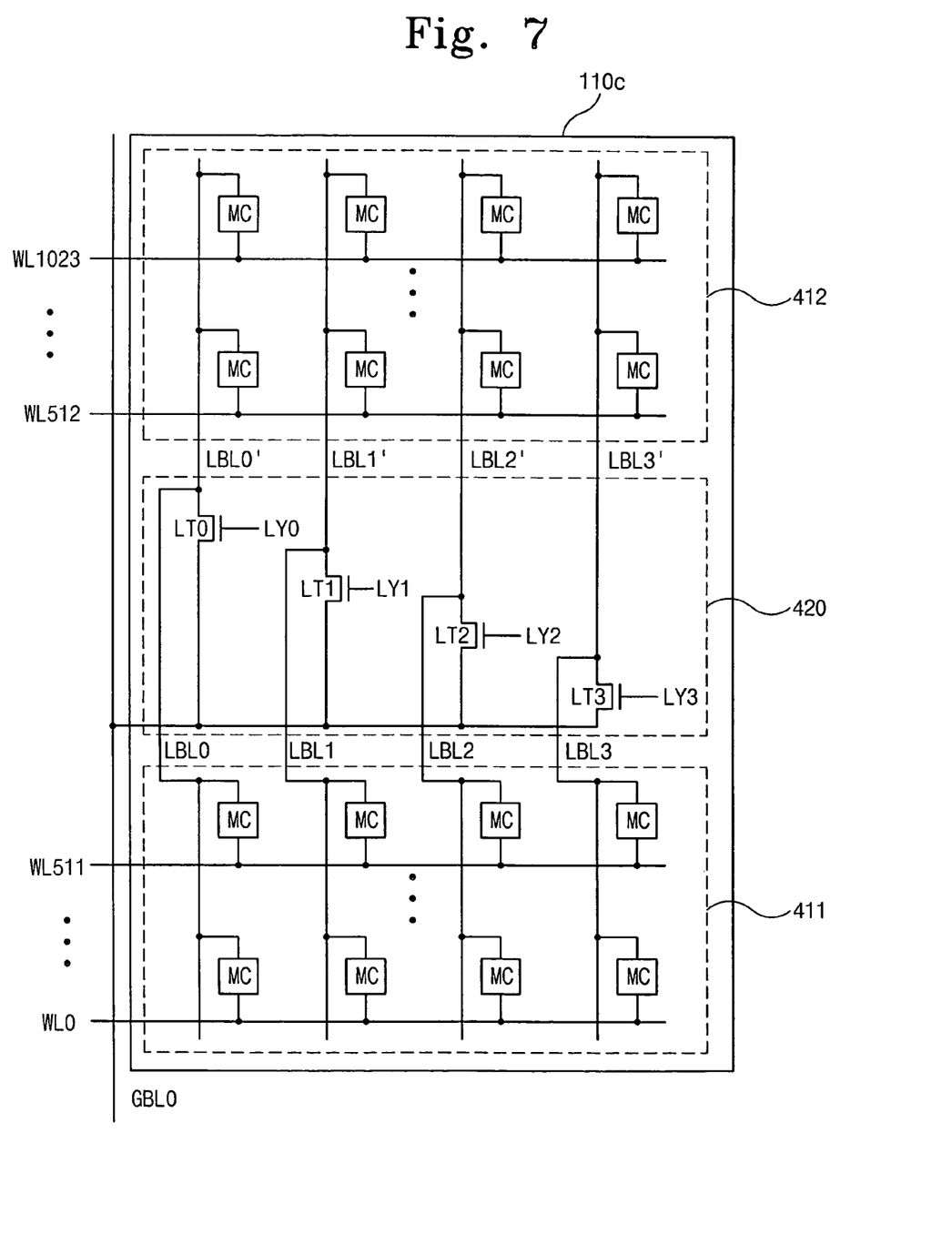
FIG. 7 illustrates a memory cell array shown in FIG. 4 according to still another embodiment of the present invention.

FIG. 7 illustrates an example memory cell array 110c of a memory cell array 110 (FIG. 4) according to an embodiment of the present invention.

As illustrated in FIG. 7, the memory cell array 110c includes a first cell region 411, a second cell region 412, and a select region 420 disposed between the first and second cell regions 411 and 412.

The first cell region 411 is connected to wordlines WL0-WL511 and first local bitlines LBL0-LBL3. The first local bitlines LBL0-LBL3 are connected to the select region 420. The second region 412 is connected to wordlines WL512-WL1023 and second local bitlines LBL0'-LBL3'. The second local bitlines LBL0'-LBL3' are connected to the select region 420.

The select region 420 includes NMOS transistors LT0-LT3, which electrically connect the global bitline GBL0 with first and second local bitlines LBL0-LBL3 and LBL0'-LBL3' in response to local select signals LY0-LY3.

The memory cell array 110c illustrated in FIG. 7 combines the aforementioned advantages of the memory cell arrays 110a and 110b illustrated in FIG. 5 and FIG. 6. Namely, according to the memory cell array 110c illustrated in FIG. 7, a layout area may be reduced and a program current may sufficiently be supplied to a selected memory cell. When, for example, a local select signal LY0 is enabled, a program current is simultaneously supplied through a first local bitline LBL0 and LBL0'.

As previously stated, the select region 420 is disposed between the first and second cell regions 411 and 412. According to the memory cell array 110c illustrated in FIG. 7, a program current is more efficiently supplied to a selected memory cell when compared to the memory cell array 110a illustrated in FIG. 5, and a layout area is reduced when compared to the memory cell array 110b illustrated in FIG. 6.

Figure 8:
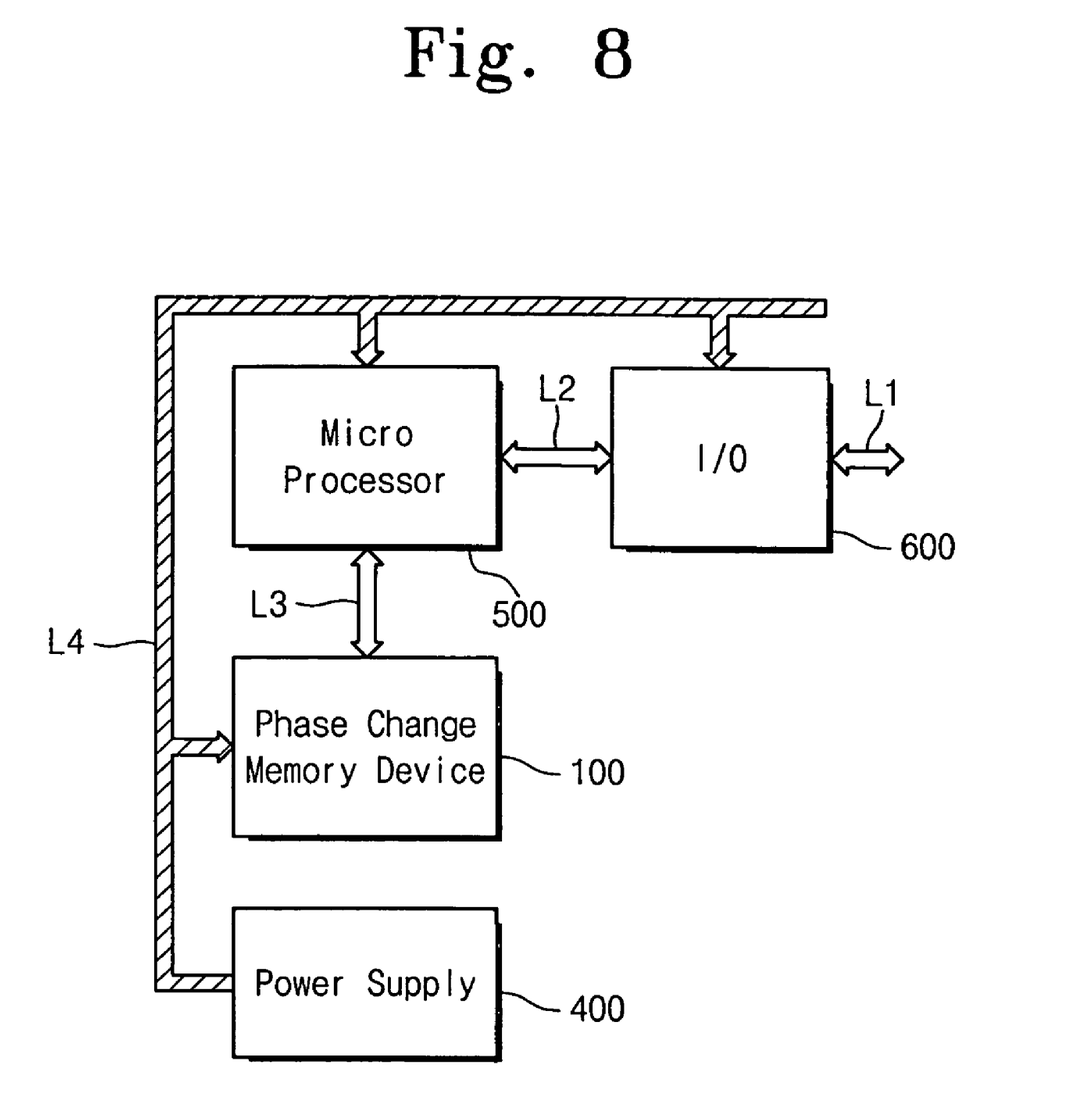
FIG. 8 illustrates a block diagram of a portable electronic system adopting a phase change memory device according to another embodiment of the present invention.

FIG. 8 is a block diagram of a portable electronic system adopting a phase change memory device 100 according to another embodiment of the present invention. The phase change memory device 100 is connected to a microprocessor 500 through a bus line L3, serving as a main memory of the portable electronic system. A battery 400 supplies a power to the microprocessor 500, an input/output device (I/O) 600, and the phase change memory device 100 through a power line L4. If data is provided to the I/O 600 through a line L1, the microprocessor 500 transfers the data to the phase change memory device 100 through a line L3 after receiving and processing the data. The phase change memory device 100 stores the transferred data in a memory cell. The data stored in the memory cell is read out by the microprocessor 500 and output to the outside through the I/O 600.

Even when the power of the battery 400 is not supplied, the data stored in the memory cell of the phase change memory device 100 is not lost due to the characteristic of a phase change material. This is because the phase change memory device 100 is a non-volatile memory device, not a DRAM. Moreover, the phase change memory device 100 has advantages such as higher speed and lower power consumption than other memory devices.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A memory cell array of a phase change memory device, comprising:
   first and second cell regions;
   a first local bitline connected to the first cell region;
   a second local bitline connected to the second cell region; and
   a select region located between the first and second cell regions, separating the first cell region from the second cell region, and connecting the first and second local bitlines with a global bitline in response to a local select signal,
   wherein the select region comprises a transistor having a gate for receiving the local select signal, a first terminal connected to the global bitline and a second terminal connected to both the first local bitline and the second local bitline.

2. The memory cell array as recited in claim 1, wherein the first cell region comprises a plurality of first memory cells connected to the first local bitline, and the second cell region comprises a plurality of second memory cells connected to the second local bitline.

3. The memory cell array as recited in claim 2, wherein the number of the first memory cells connected to the first local bitline is equal to the number of the second memory cells connected to the second local bitline.

4. The memory cell array as recited in claim 2, wherein each of the first and second memory cells comprises:
a memory element including a phase change material; and
a select element for selecting the memory element.

5. The memory cell array as recited in claim 4, wherein the select element is a diode coupled between the memory element and a wordline.

6. The memory cell array as recited in claim 1, wherein the select region simultaneously connects the first and second local bitlines with the global bitline in response to the local select signal.

7. The memory cell array as recited in claim 6, wherein the transistor comprises an NMOS transistor, and the first terminal comprises a drain connected to the global bitline, and the second terminal comprises a source connected to the first and second local bitlines.

8. A phase change memory device, comprising:
a memory cell array comprising a plurality of memory cells; and
a write driver for supplying a program current to the memory cell array through a global bitline,
wherein the memory cell array comprises first and second cell regions, a first local bitline connected to the first cell region, a second local bitline connected to the second cell region, and a select region located between the first and second cell regions, separating the first cell region from the second cell region and supplying the program current supplied through the global bitline to the first and second local bitlines in response to a local select signal, and
wherein the select region comprises a transistor having a gate for receiving the local select signal, a first terminal connected to the global bitline and a second terminal connected to both the first local bitline and the second local bitline.

9. The phase change memory device as recited in claim 8, wherein each of the memory cells comprises:
a memory element including a phase change material; and
a select element for selecting the memory element.

10. The phase change memory device as recited in claim 9, wherein the select element is a diode coupled between the memory element and a wordline.

11. The phase change memory device as recited in claim 8, wherein the number of the memory cells connected to the first local bitline is equal to the number of the memory cells connected to the second local bitline.

12. The phase change memory device as recited in claim 8, wherein the select region simultaneously connects the first and second local bitlines with the global bitline in response to the local select signal.

13. The phase change memory device as recited in claim 12, wherein the transistor comprises an NMOS transistor, the first terminal comprises a drain connected to the global bitline, and the second terminal comprises a source connected to the first and second local bitlines.

14. A memory cell array of a phase change memory device, comprising:
a first cell region and a second cell region;
a first local bitline connected to the first cell region;
a second local bitline connected to the second cell region; and
a select region located between the first cell region and the second cell region, the select region connecting the first local bitline and the second local bitline to a global bitline in response to a local select signal during a write operation,
wherein the first and second cell regions comprise a plurality of memory cells respectively connected to the first and second local bitlines.

15. The memory cell array as recited in claim 14, wherein the number of the memory cells connected to the first local bitline is equal to the number of the memory cells connected to the second local bitline.

16. The memory cell array as recited in claim 14, wherein the select region simultaneously connects the first and second local bitlines with the global bitline in response to the local select signal.

17. The memory cell array as recited in claim 16, wherein the select region comprises a transistor having a gate which receives the local select signal, a drain connected to the global bitline, and a source connected to the first and second local bitlines.

18. A resistance variable memory device, comprising:
a memory cell array including a plurality of memory cells; and
a write driver for supplying a program current to the memory cell array through a global bitline,
wherein the memory cell array comprises first and second cell regions, a first local bitline connected to the first cell region, a second local bitline connected to the second cell region, and a select region located between the first and second cell regions and supplying the program current supplied through the global bitline to the first and second local bitlines in response to a local select signal for a program operation.

19. The resistance variable memory device as recited in claim 18, wherein each of the plurality of memory cells comprises a memory element, including a phase change material, and a select element, including a diode coupled between the memory element and a wordline, for selecting the memory element, and
wherein the number of the memory cells connected to the first local bitline is equal to the number of the memory cells connected to the second local bitline.

20. The resistance variable memory device as recited in claim 18, wherein the select region simultaneously connects the first and second local bitlines with the global bitline in response to the local select signal.

* * * * *